United States Patent
Zhou et al.

(10) Patent No.: US 9,761,447 B2
(45) Date of Patent: Sep. 12, 2017

(54) METHOD FOR MANUFACTURING TFT SUBSTRATE AND TFT SUBSTRATE MANUFACTURED THEREOF

(71) Applicant: Shenzhen China Star Optoelectronics Technology Co., Ltd., Shenzhen (CN)

(72) Inventors: Xingyu Zhou, Shenzhen (CN); Yuanchun Wu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 126 days.

(21) Appl. No.: 14/781,308

(22) PCT Filed: Aug. 21, 2015

(86) PCT No.: PCT/CN2015/087720
§ 371 (c)(1),
(2) Date: Sep. 30, 2015

(87) PCT Pub. No.: WO2017/008368
PCT Pub. Date: Jan. 19, 2017

(65) Prior Publication Data
US 2017/0154773 A1 Jun. 1, 2017

(30) Foreign Application Priority Data
Jul. 16, 2015 (CN) .......................... 2015 1 0420705

(51) Int. Cl.
*H01L 21/02* (2006.01)
*H01L 29/66* (2006.01)
*H01L 21/265* (2006.01)
*H01L 29/786* (2006.01)
*H01L 27/12* (2006.01)

(52) U.S. Cl.
CPC .. *H01L 21/02667* (2013.01); *H01L 21/02532* (2013.01); *H01L 21/02592* (2013.01); *H01L 21/26513* (2013.01); *H01L 27/1222* (2013.01); *H01L 29/66765* (2013.01);
(Continued)

(58) Field of Classification Search
None
See application file for complete search history.

(56) References Cited

U.S. PATENT DOCUMENTS 7,663,143 B2 * 2/2010 Hwang ............... H01L 27/1214
257/257
2002/0180897 A1 * 12/2002 Chae .................. G02F 1/136213
349/39

(Continued)

FOREIGN PATENT DOCUMENTS

CN       1577772 A       2/2005
CN     104409512 A       3/2015

*Primary Examiner* — Michelle Mandala
(74) *Attorney, Agent, or Firm* — Leong C. Lei

(57) ABSTRACT

The invention provides a method for manufacturing a TFT substrate and a TFT substrate manufactured thereof. In the above TFT substrate, the low temperature poly-silicon layer is produced by solid phase crystallization, the cost of production is under budget, and the TFT substrate is a double-grid structure that can guarantee the electrical characteristics of the thin film transistor and better the capacity of drive, and leakage phenomenon caused by groove light seldom happens.

12 Claims, 4 Drawing Sheets

(52) U.S. Cl.
   CPC .. *H01L 29/78618* (2013.01); *H01L 29/78633* (2013.01); *H01L 29/78678* (2013.01)

(56) References Cited

U.S. PATENT DOCUMENTS

| | | | |
|---|---|---|---|
| 2007/0004185 A1* | 1/2007 | Kakkad | H01L 21/02532 438/486 |
| 2012/0001156 A1* | 1/2012 | Cho | H01L 27/1248 257/40 |

* cited by examiner

METHOD FOR MANUFACTURING TFT SUBSTRATE AND TFT SUBSTRATE MANUFACTURED THEREOF

BACKGROUND

1. Technical Field

The invention relates to the field of display technology, and more particularly to a method for manufacturing a TFT substrate and a TFT substrate manufactured thereof.

2. Description of the Related Art

With the enhancement of tablet display technology, requirements of panels with high resolution and low energy consumption are rising. Due to electronic mobility is high, much attention has been devoted to low temperature poly-silicon (LTPS) in realms of liquid crystal display (LCD) and organic light emitting diode (OLED), LTPS is regarded as a critical material for realizing a full-color tablet display with a small budget. To tablets, a low temperature poly-silicon material takes advantage of high resolution, rapid response time, highlight, high aperture opening ratio, low energy consumption, and a low temperature poly-silicon can be manufactured at low temperatures, and regarded as a subject of extensive study for using in producing a complementary metal oxide semiconductor (C-MOS) circuit to meet the requirements of high resolution and low energy consumption of panels.

At the beginning period of development of poly-silicon technology, a high temperature oxidation process of laser anneal is applied to convert a glass substrate from amorphous silicon to poly-silicon in order to produce high temperature poly-silicon (HTPS), the temperature of the glass substrate will be more than 1000° at this point. Compared with conventional high temperature poly-silicon, low temperature poly-silicon needs laser irradiation as well, but an excimer laser is used as a heat source, after passing through a transmission system, a laser forms a laser beam that energy distributes evenly and projected on to an amorphous silicon glass substrate, after absorbing energy of the excimer laser, an amorphous silicon glass substrate will converts into a glass substrate with poly-silicon structure. As the entire process is basically done below 600° C., a temperature most glass substrates can endure, costs of manufacture can be reduced. Besides costs reduction of manufacture, other advantages of low temperature poly-silicon include faster electronic mobility and better stability.

Methods for manufacturing low temperature poly-silicon include solid phase crystallization (SPC), metal-induced crystallization (MIC) and excimer laser annealing (ELA). Among which, ELA is the most widely spread and sophisticated way to manufacture low temperature poly-silicon, the process mainly is: forming a buffering layer on the glass substrate, then forming an amorphous silicon layer on the buffering layer, dehydrogenating by high temperature, utilizing an ELA laser beam to scan the amorphous silicon so as to execute excimer laser annealing, the amorphous silicon absorbing energy from the laser and reaching high temperature in a very short time and then melting, finally cooling to recrystallize into poly-silicon. The fact encountered currently is that low temperature poly-silicon thin film transistors produced by the method ELA are not identity and over budget, the method SPC can decrease costs and increase identity, but open current and slope of subthreshold are defeated by low temperature poly-silicon thin film transistors produced by ELA, and off-current is big, because of which the drive capacity is poor.

SUMMARY

The object of the invention can be providing a method for manufacturing a TFT substrate, which can reduce costs of production and increase open current of thin film transistors simultaneously, and warping effect can be curbed by reducing off-current, threshold voltage and slope of subthreshold decrease, and leakage phenomenon caused by groove light seldom happens.

The object of the invention can also be providing a TFT substrate, which can be produced on or under budget and increase open current of thin film transistors simultaneously, and warping effect can be curbed by reducing off-current, threshold voltage and slope of subthreshold decrease, and leakage phenomenon caused by groove light seldom happens.

To pursue the previous purpose, the invention provides a method for manufacturing a TFT substrate, including a sequence as follows:

Step 1. A substrate is provided, after cleansing and pre-toasting the substrate, a buffering layer is deposited on the substrate;

Step 2. A first metal layer is deposited on the buffering layer, and the first metal layer is patterned to achieve a bottom grid;

Step 3. A grid insulating layers is deposited on the bottom grid and the buffering layer, an amorphous silicon layer is disposed on the grid insulating layer;

Step 4. The amorphous silicon layer is p-type doped to achieve an upper p-type doped amorphous silicon layer and an amorphous silicon layer without doping below the p-type doped amorphous silicon layer;

Step 5. The amorphous silicon layer without doping and the p-type doped amorphous silicon layer are converted into a low temperature poly-silicon layer without doping and a p-type doped low temperature poly-silicon layer by solid phase crystallization, the low temperature poly-silicon layer without doping and the p-type doped low temperature poly-silicon layer are patterned to form a low temperature poly-silicon island by a photoetching process;

Step 6. A second metal layer is deposited on the low temperature poly-silicon island and the grid insulating layer, a groove region corresponding to superstructure of the bottom grid is defined on the low temperature poly-silicon layer without doping of the low temperature poly-silicon island, the second metal layer and the low temperature poly-silicon island are patterned by a photoetching process to remove the p-type doped low temperature poly-silicon layer on the superstructure of the groove region and the second metal layer to form a source electrode and a drain electrode corresponding to two sides of the groove region as well as a first p-type doped low temperature poly-silicon layer and a second p-type doped low temperature poly-silicon layer;

The source and drain electrodes are connected to the first and the second p-type doped low temperature poly-silicon layers respectively;

Step 7. A passivation layer is deposited on the source electrode, the drain electrode, the groove region and the grid insulating layer;

Step 8. A third metal layer is deposited on the passivation layer, and the third metal layer is patterned to achieve a top grid corresponding to the bottom grid.

In the Step 4, the amorphous silicon layer is doped by boron ions with boroethane vapor as a dopant.

In the Step 5, the amorphous silicon layer without doping and the p-type doped amorphous silicon layer are heated by rapid thermal annealing in the process of solid phase crystallization, heating at 670~730° C. for 10~30 min.

In the Step 2, the bottom grid is a single-layered aluminum structure, a single-layered molybdenum structure or a triple layered structure that a layer of aluminum clamped by two layers of molybdenum; thickness of the bottom grid is 1500~2000 A;

In the Step 8, the top grid is a single layered aluminum structure, a single layered molybdenum structure or a triple layered structure that a layer of aluminum clamped by two layers of molybdenum; thickness of the top grid is 1500~2000 A.

Size, thickness and material of the top grid and the bottom grid are the same.

The invention also provides a TFT substrate, including: a substrate, a buffering layer disposed on the substrate, a bottom grid disposed on the buffering layer, a grid insulating layer disposed on the buffering layer and the bottom grid, a low temperature poly-silicon island disposed on the grid insulating layer, a source electrode and a drain electrode disposed on the low temperature poly-silicon island and the grid insulating layer, a passivation layer disposed on the source, drain electrodes, the low temperature poly-silicon island and the grid insulating layer, and a top grid on the passivation layer corresponding to the bottom grid;

The low temperature poly-silicon island includes a low temperature poly-silicon layer without doping and a p-type doped low temperature poly-silicon layer disposed on the low temperature poly-silicon layer without doping, a groove region corresponding to the bottom grid and the top grid is disposed on the low temperature poly-silicon layer without doping, the p-type doped low temperature poly-silicon layer includes a first p-type doped low temperature poly-silicon layer and a second p-type doped low temperature poly-silicon layer corresponding to the two sides of the groove region; the source and drain electrodes are connected to the first and the second p-typed doped low temperature poly-silicon layers respectively.

A dopant doped into the first p-typed doped low temperature poly-silicon layer and the second p-typed doped low temperature poly-silicon layer is boron ion.

The substrate is a glass substrate; the buffering layer is a single layered structure consisting of silicon nitride, a single layered structure consisting of silicon oxide or a double layered structure consisting of a silicon nitride layer and a silicon oxide layer.

The bottom grid is a single layered aluminum structure, a single layered molybdenum structure or a triple layered structure that a layer of aluminum clamped by two layers of molybdenum; thickness of the bottom grid is 1500~2000 A;

The top grid is a single layered aluminum structure, a single layered molybdenum structure or a triple layered structure that a layer of aluminum clamped by two layers of molybdenum; thickness of the top grid is 1500~2000 A.

Size, thickness and material of the top grid and the bottom grid are the same.

The invention also provides a TFT substrate, including a substrate, a buffering layer disposed on the substrate, a bottom grid disposed on the buffering layer, a grid insulating layer disposed on the buffering layer and the bottom grid, a low temperature poly-silicon island disposed on the grid insulating layer, a source electrode and a drain electrode disposed on the low temperature poly-silicon island and the grid insulating layer, a passivation layer disposed on the source, drain electrodes, the low temperature poly-silicon island and the grid insulating layer, and a top grid disposed on the passivation layer corresponding to the bottom grid;

The low temperature poly-silicon island includes a low temperature poly-silicon layer without doping and a p-type doped low temperature poly-silicon layer disposed on the low temperature poly-silicon layer without doping, a groove region corresponding to the bottom grid and the top grid is disposed on the low temperature poly-silicon layer without doping, the p-type doped low temperature poly-silicon layer includes a first p-type doped low temperature poly-silicon layer and a second p-type doped low temperature poly-silicon layer corresponding to two sides of the groove region; the source and drain electrodes are connected to the first and the second p-typed doped low temperature poly-silicon layers respectively;

A dopant doped into the first p-typed doped low temperature poly-silicon layer and the second p-typed doped low temperature poly-silicon layer is boron ion;

The substrate is a glass substrate; the buffering layer is a single layered structure consisting of silicon nitride, a single layered structure consisting of silicon oxide or a double layered structure consisting of a silicon nitride layer and a silicon oxide layer;

The bottom grid is a single layered aluminum structure, a single layered molybdenum structure or a triple layered structure that a layer of aluminum clamped by two layers of molybdenum; thickness of the bottom grid is 1500~2000 A;

The top grid is a single layered aluminum structure, a single layered molybdenum structure or a triple layered structure that a layer of aluminum clamped by two layers of molybdenum; thickness of the top grid is 1500~2000 A.

Desired effects of the invention is: the invention provides a method for manufacturing a TFT substrate and a TFT substrate manufactured thereof, a low temperature poly-silicon layer is produced by solid phase crystallization according to the method, compared with excimer laser crystallization technology, the solid phase crystallization is more economic and identical; a double layered structure induced at the same time that can cause strong control over the groove, increasing open current of the thin film transistor, reducing off-current to curb warping effect, decreasing threshold voltage and slope of subthreshold, improving the capacity of driving thin film transistors, the top grid can also act as a shield insulating light to decrease leakage phenomenon caused by groove light. A TFT substrate provided by the invention, the low temperature poly-silicon layer is produced by solid phase crystallization, costs can be held below budget, the TFT substrate is a double-grid structure that can guarantee the electrical characteristics of the thin film transistor and better the capacity of drive, and leakage phenomenon caused by groove light seldom happens.

In the following detailed description of the preferred embodiments, reference is made to the accompanying drawings which form a part hereof, and in which is shown by way of illustration specific embodiments, rather than limitation, in which the invention may be practiced.

BRIEF DESCRIPTION OF THE DRAWINGS

With the following reference to accompanying drawings, concrete embodiments of the invention will be described in detail to better understand the invention.

In the drawings.

DETAILED DESCRIPTION

By the following detailed description with reference to accompanying drawings, other aspects and features of the invention will become apparent.

Figure 1:
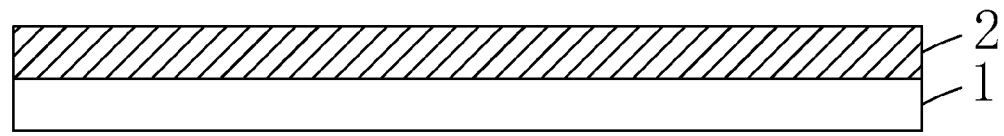
FIG. 1 is a schematic view of Step 1 of method of manufacturing a TFT substrate of the invention.

The invention first provides a method for manufacturing a TFT substrate, including the following sequence:

Step 1, as shown in FIG. 1, providing a substrate 1, after cleansing and pre-toasting the substrate 1, depositing a buffering layer 2 on the substrate 1;

Specifically, the substrate 1 can be a glass substrate.

Specifically, the buffering layer 2 can be a single layered structure consisting of silicon nitride, a single layered structure consisting of silicon oxide or a double layered structure consisting of a silicon nitride layer and a silicon oxide layer. Preferably, thickness of the buffering layer 2 can be 500~2000 Å.

Figure 2:
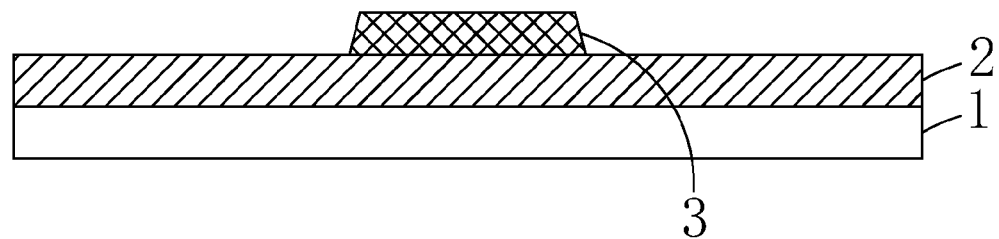
FIG. 2 is a schematic view of Step 2 of method of manufacturing a TFT substrate of the invention.

Step 2, as shown in FIG. 2, depositing a first metal layer on the buffering layer 2, and patterning the first metal layer to achieve a bottom grid 3;

Specifically, the bottom grid 3 is a single-layered aluminum structure, a single-layered molybdenum structure or a triple layered structure that a layer of aluminum clamped by two layers of molybdenum. Preferably, thickness of the bottom grid 3 is 1500~2000 Å.

Figure 3:
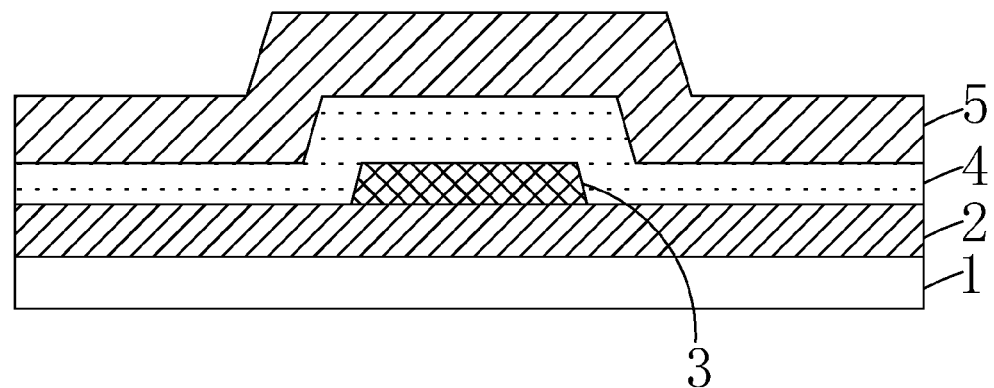
FIG. 3 is a schematic view of Step 3 of method of manufacturing a TFT substrate of the invention.

Step 3, as shown in FIG. 3, depositing a grid insulating layer 4 on the bottom grid 3 and the buffering layer 2, depositing an amorphous silicon layer 5 on the grid insulating layer 4.

Specifically, the grid insulating layer 4 can be a single layered structure consisting of silicon nitride, a single layered structure consisting of silicon oxide or a double layered structure consisting of a silicon nitride layer and a silicon oxide layer. Preferably, thickness of the grid insulating layer 4 can be 500~2000 Å.

Preferably, thickness of the amorphous silicon layer 5 can be 500~2000 Å.

Figure 4:
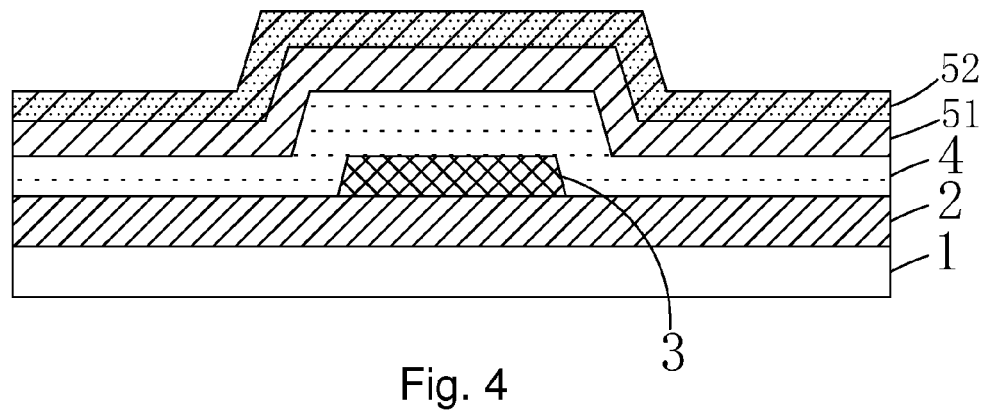
FIG. 4 is a schematic view of Step 4 of method of manufacturing a TFT substrate of the invention.

Step 4, as shown in FIG. 4, P-type doping the amorphous silicon layer 5 to achieve an upper p-type doped amorphous silicon layer 52 and an amorphous silicon layer without doping 51 below the p-type doped amorphous silicon layer 52.

Specifically, the amorphous silicon layer 5 is doped by boron ions ($B^+$) with boroethane ($B_2H_6$) vapor as a dopant.

Figure 5:
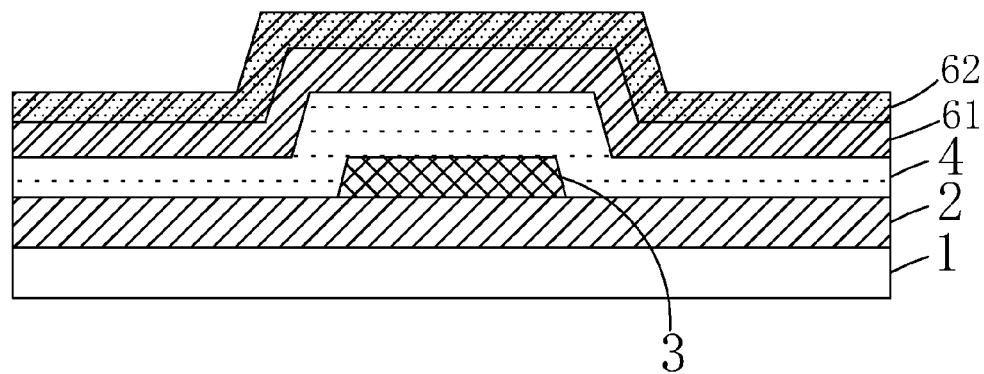
FIGS. 5-6 are schematic views of Step 5 of method of manufacturing a TFT substrate of the invention.
Figure 6:
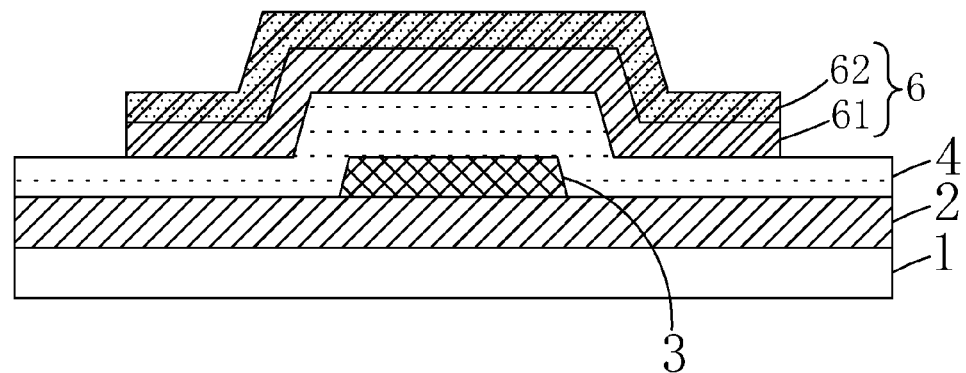

Step 5, as shown in FIG. 5, converting the amorphous silicon layer without doping 51 and the p-type doped amorphous silicon layer 52 into a low temperature poly-silicon layer without doping 61 and a p-type doped low temperature poly-silicon layer 62 by solid phase crystallization (SPC), as shown in FIG. 6, patterning the low temperature poly-silicon layer without doping 61 and the p-type doped low temperature poly-silicon layer 62 by a photoetching process to form a low temperature poly-silicon island 6.

Specifically, the amorphous silicon layer without doping 51 and the p-type doped amorphous silicon layer 52 are heated by rapid thermal annealing (RTA) in the process of solid phase crystallization, heating at 670~730° C. for 10~30 min.

Figure 7:
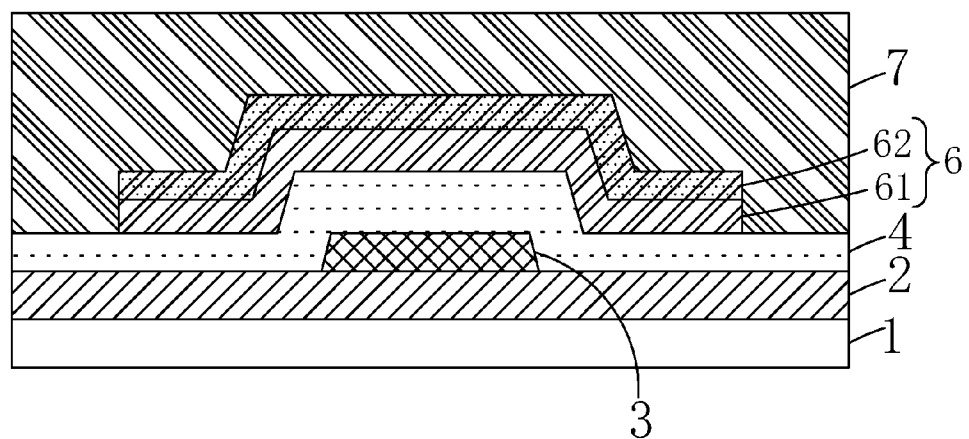
FIGS. 7-8 are schematic views of Step 6 of method of manufacturing a TFT substrate of the invention.
Figure 8:
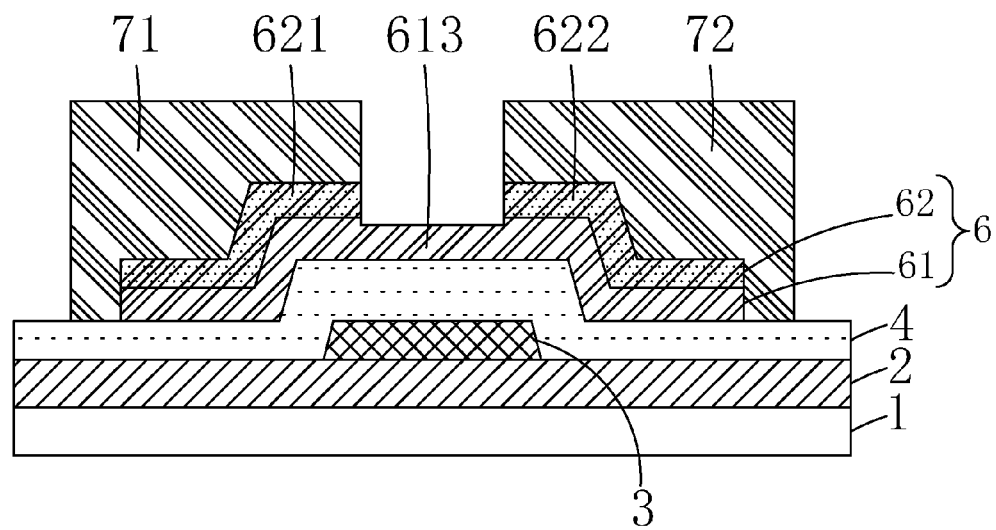

Step 6, as shown in FIG. 7, depositing a second metal layer 7 on the low temperature poly-silicon island 6 and the grid insulating layer 4, as shown in FIG. 8, defining a groove region 613 above the bottom grid 3 on the low temperature poly-silicon layer without doping 61 of the low temperature poly-silicon island 6, patterning the second metal layer 7 and the low temperature poly-silicon island 6 by a photoetching process to remove the p-type doped low temperature poly-silicon layer 62 and the second metal layer 7 on the groove region 613 to form a source electrode 71 and a drain electrode 72 and a first p-type doped low temperature poly-silicon layer 621 and a second p-type doped low temperature poly-silicon layer 622 corresponding to two sides of the groove region 613;

The source electrode 71 and the drain electrode 72 are connected to the first p-type doped low temperature poly-silicon layer 621 and the second p-type doped low temperature poly-silicon layer 622 respectively;

Specifically, width of the groove region 613 is less than that of the bottom grid 3.

Specifically, the source electrode 71 and the drain electrode 72 can be a single-layered aluminum structure, a single-layered molybdenum structure or a triple layered structure that a layer of aluminum clamped by two layers of molybdenum respectively. Preferably, thickness of the source electrode 71 and the drain electrode 72 can be 1500~2000 Å.

Figure 9:
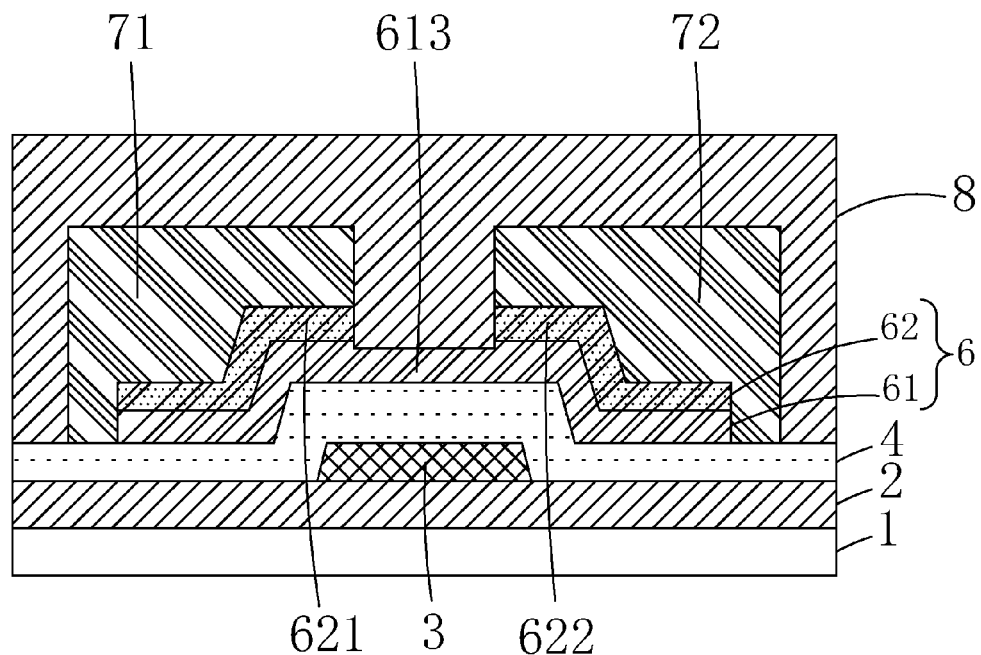
FIG. 9 is a schematic view of Step 7 of method of manufacturing a TFT substrate of the invention.

Step 7, as shown in FIG. 9, depositing a passivation layer 8 on the source electrode 71, the drain electrode 72, the groove region 613 and the grid insulating layer 4.

Specifically, the buffering layer 8 can be a single layered structure consisting of silicon nitride, a single layered structure consisting of silicon oxide or a double layered structure consisting of a silicon nitride layer and a silicon oxide layer. Preferably, thickness of the buffering layer 8 can be 3000~4000 Å.

Figure 10:
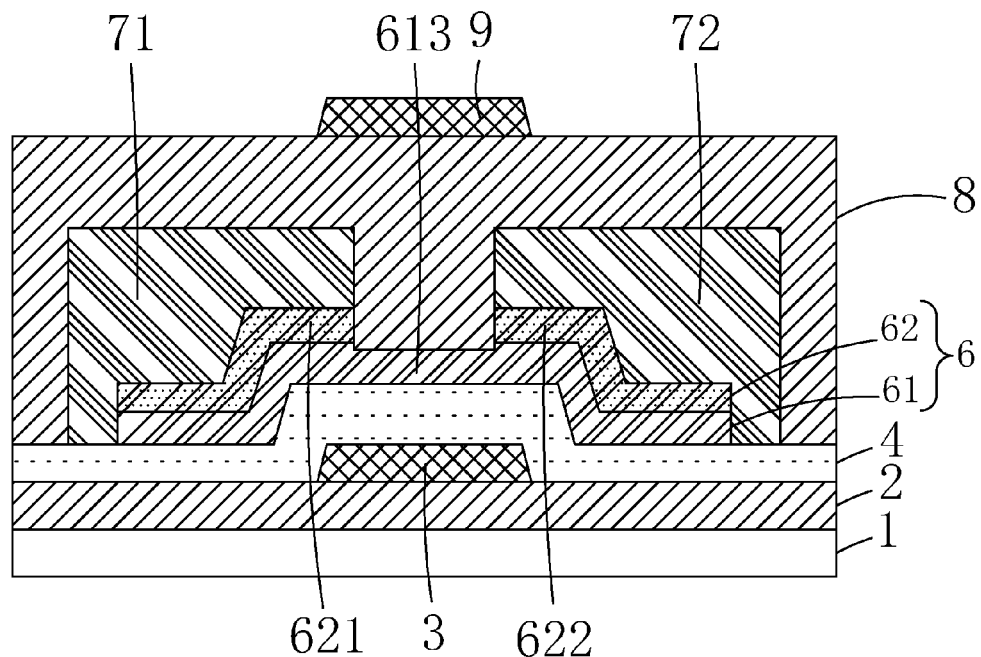
FIG. 10 is a schematic view of Step 8 of method of manufacturing a TFT substrate of the invention, which can also indicate a schematic view of a TFT substrate of the invention.

Step 8, as shown in FIG. 10, depositing a third metal layer on the passivation layer 8, and patterning the third metal layer to achieve a top grip 9 corresponding to the bottom grid 3.

Specifically, the top grid 9 can be a single-layered aluminum structure, a single-layered molybdenum structure or a triple layered structure that a layer of aluminum clamped by two layers of molybdenum. Preferably, thickness of the top grid 9 can be 1500~2000 Å.

Preferably, size, thickness and material of the top grid 9 and the bottom grid 3 are the same.

Referring to FIG. 10, based on the method of manufacturing a TFT substrate above, the invention also provides a TFT substrate manufactured by the previous method, including: a substrate 1, a buffering layer 2 disposed on the substrate 1, a bottom grid 3 disposed on the buffering layer 2, a grid insulating layer 4 disposed on the buffering layer 2 and the bottom grid 3, a low temperature poly-silicon island 6 disposed on the grid insulating layer 4, a source electrode 71 and a drain electrode 72 disposed on the low temperature poly-silicon island 6 and the grid insulating layer 4, a passivation layer 8 disposed on the source electrode 71, the drain electrode 72, the low temperature poly-silicon island 6 and the grid insulating layer 4, and a top grid 9 disposed on the passivation layers 8 corresponding to the bottom grid 3;

The low temperature poly-silicon island 6 includes a low temperature poly-silicon layer without doping 61 and a p-type doped low temperature poly-silicon layer 62 disposed on the low temperature poly-silicon layer without doping 61, a groove region 613 corresponding to the bottom grid 3 and the top grid 9 is disposed on the low temperature poly-silicon layer without doping 61, the p-type doped low temperature poly-silicon layer 62 includes a first p-type doped low temperature poly-silicon layer 621 and a second p-type doped low temperature poly-silicon layer 622 corresponding to two sides of the groove region 613; the source electrode 71 and the drain electrode 72 are connected to the first p-typed doped low temperature poly-silicon layer 621 and the second p-typed doped low temperature poly-silicon layer 622 respectively.

Specifically, the substrate 1 can be a glass substrate.

Specifically, the buffering layer 2 can be a single layered structure consisting of silicon nitride, a single layered structure consisting of silicon oxide or a double layered structure consisting of a silicon nitride layer and a silicon oxide layer. Preferably, thickness of the buffering layer 2 can be 500~2000 A.

Specifically, the bottom grid 3 can be a single layered aluminum structure, a single layered molybdenum structure or a triple layered structure that a layer of aluminum clamped by two layers of molybdenum. Preferably, thickness of the bottom grid 3 is 1500~2000 A.

Specifically, the grid insulating layer 4 can be a single layered structure consisting of silicon nitride, a single layered structure consisting of silicon oxide or a double layered structure consisting of a silicon nitride layer and a silicon oxide layer. Preferably, thickness of the grid insulating layer 4 can be 500~2000 A.

Specifically, thickness of the low temperature poly-silicon island 6 can be 500~2000 A.

Specifically, width of the groove region 613 is less than that of the bottom grid 3.

Specifically, a dopant doped into the first p-typed doped low temperature poly-silicon layer 621 and the second p-typed doped low temperature poly-silicon layer 622 is boron ion ($B^+$).

Specifically, the source electrode 71 and the drain electrode 72 can be a single layered aluminum structure, a single layered molybdenum structure or a triple layered structure that a layer of aluminum clamped by two layers of molybdenum respectively. Preferably, thickness of the source electrode 71 and the drain electrode 72 can be 1500~2000 A.

Specifically, the buffering layer 8 can be a single layered structure consisting of silicon nitride, a single layered structure consisting of silicon oxide or a double layered structure consisting of a silicon nitride layer and a silicon oxide layer. Preferably, thickness of the buffering layer 8 can be 3000~4000 A.

Specifically, the top grid 9 can be a single layered aluminum structure, a single layered molybdenum structure or a triple layered structure that a layer of aluminum clamped by two layers of molybdenum. Preferably, thickness of the top grid 9 can be 1500~2000 A.

Preferably, size, thickness and material of the top grid 9 and the bottom grid 3 are the same.

In conclusion, the invention provides a method for manufacturing a TFT substrate and a TFT substrate manufactured thereof, a low temperature poly-silicon layer is produced by solid phase crystallization according to the method, and compared with excimer laser crystallization technology, the solid phase crystallization is more economic and identical; a double layered structure induced at the same time that can cause strong control over the groove, increasing open current of the thin film transistor, reducing off-current to curb warping effect, decreasing threshold voltage and slope of subthreshold, improving the capacity of drive of thin film transistors, the top grid can also act as a shield insulating light to decrease leakage phenomenon caused by groove light. A TFT substrate according to the invention, the low temperature poly-silicon layer is produced by solid phase crystallization, the cost of production is under budget, and the TFT substrate is a double-grid structure that can guarantee the electrical characteristics of the thin film transistor and better the capacity of drive, and leakage phenomenon caused by groove light seldom happens.

For those skilled persons in the art, various modifications and variations can be made according to the concept of the invention, and therefore the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a TFT substrate, comprising:

Step 1, providing a substrate, after cleansing and pre-toasting the substrate, depositing a buffering layer on the substrate;

Step 2, depositing a first metal layer on the buffering layer, patterning the first metal layer to achieve a bottom grid;

Step 3, depositing a grid insulating layer on the bottom grid and the buffering layer, depositing an amorphous silicon layer on the grid insulating layer;

Step 4, P-type doping the amorphous silicon layer to achieve an upper p-type doped amorphous silicon layer and an amorphous silicon layer without doping below the p-type doped amorphous silicon layer;

Step 5, converting the amorphous silicon layer without doping and the p-type doped amorphous silicon layer into a poly-silicon layer without doping and a p-type doped poly-silicon layer by solid phase crystallization, patterning the poly-silicon layer without doping and the p-type doped poly-silicon layer by a photoetching process to form a poly-silicon island;

Step 6, depositing a second metal layer on the poly-silicon island and the grid insulating layer, defining a groove region above the bottom grid on the poly-silicon layer without doping of the poly-silicon island, patterning the second metal layer and the poly-silicon island by a photoetching process to remove the p-type doped poly-silicon layer and the second metal layer on the groove region, so as to form a source electrode and a drain electrode as well as a first p-type doped poly-silicon layer and a second p-type doped poly-silicon layer on two sides of the groove region respectively;

the source and drain electrodes being connected to the first and the second p-type doped poly-silicon layers respectively;

Step 7, depositing a passivation layer on the source electrode, the drain electrode, the groove region and the grid insulating layer;

Step 8, depositing a third metal layer on the passivation layer, and patterning the third metal layer to achieve a top grid corresponding to the bottom grid.

2. The method for manufacturing a TFT substrate according to claim 1, wherein the amorphous silicon layer is doped by boron ions with boroethane vapor as a dopant in the Step 4.

3. The method for manufacturing a TFT substrate according to claim 1, wherein the amorphous silicon layer without doping and the p-type doped amorphous silicon layer are heated by rapid thermal annealing in the process of solid phase crystallization in the Step 5, heating at 670~730° C. for 10~30 min.

4. The method for manufacturing a TFT substrate according to claim 1, wherein the bottom grid is a single-layered aluminum structure, a single-layered molybdenum structure or a triple layered structure that a layer of aluminum clamped by two layers of molybdenum in the Step 2; thickness of the bottom grid is 1500~2000 A;

the top grid is a single-layered aluminum structure, a single-layered molybdenum structure or a triple layered structure that a layer of aluminum clamped by two layers of molybdenum in the Step 8; thickness of the top grid is 1500~2000 A.

5. The method for manufacturing a TFT substrate according to claim 4, wherein size, thickness and material of the top grid and the bottom grid are the same.

6. A TFT substrate, comprising: a substrate, a buffering layer disposed on the substrate, a bottom grid disposed on the buffering layer, a grid insulating layer disposed on the buffering layer and the bottom grid, a poly-silicon island disposed on the grid insulating layer, a source electrode and a drain electrode disposed on the poly-silicon island and the grid insulating layer, a passivation layer disposed on the source, drain electrodes, the poly-silicon island and grid insulating layer, and a top grid disposed on the passivation layer corresponding to the bottom grid;

wherein the poly-silicon island comprises a poly-silicon layer without doping and a p-type doped poly-silicon layer disposed on the poly-silicon layer without doping, a groove region corresponding to the bottom grid and the top grid is disposed on the poly-silicon layer without doping, the p-type doped poly-silicon layer comprises a first p-type doped poly-silicon layer and a second p-type doped poly-silicon layer corresponding to two sides of the groove region; the source and drain electrodes are connected to the first and the second p-typed doped poly-silicon layers respectively.

7. The TFT substrate according to claim 6, wherein a dopant doped into the first p-typed doped poly-silicon layer and the second p-typed doped poly-silicon layer is boron ion.

8. The TFT substrate according to claim 6, wherein the substrate is a glass substrate; the buffering layer is a single layered structure consisting of silicon nitride, a single layered structure consisting of silicon oxide or a double layered structure consisting of a silicon nitride layer and a silicon oxide layer.

9. The TFT substrate according to claim 6, wherein the bottom grid is a single layered aluminum structure, a single layered molybdenum structure or a triple layered structure that a layer of aluminum clamped by two layers of molybdenum; thickness of the bottom grid is 1500~2000 A;

the top grid is a single layered aluminum structure, a single layered molybdenum structure or a triple layered structure that a layer of aluminum clamped by two layers of molybdenum; thickness of the top grid is 1500~2000 A.

10. The TFT substrate according to claim 9, wherein size, thickness and material of the top grid and the bottom grid are the same.

11. A TFT substrate, comprising a substrate, a buffering layer disposed on the substrate, a bottom grid disposed on the buffering layer, a grid insulating layer disposed on the buffering layer and the bottom grid, a poly-silicon island disposed on the grid insulating layer, a source electrode and a drain electrode disposed on the poly-silicon island and the grid insulating layer, a passivation layer disposed on the source, drain electrodes, the poly-silicon island and the grid insulating layer, and a top grid corresponding to the bottom grid disposed on the passivation layer;

wherein the poly-silicon island comprises a poly-silicon layer without doping and a p-type doped poly-silicon layer disposed on the poly-silicon layer without doping, a groove region corresponding to the bottom grid and the top grid is disposed on the poly-silicon layer without doping, the p-type doped poly-silicon layer comprises a first p-type doped poly-silicon layer and a second p-type doped poly-silicon layer corresponding to two sides of the groove region; the source and drain electrodes are connected to the first and the second p-typed doped poly-silicon layers respectively;

wherein a dopant doped into the first p-typed doped poly-silicon layer and the second p-typed doped poly-silicon layer is boron ion;

wherein the substrate is a glass substrate; the buffering layer is a single layered structure consisting of silicon nitride, a single layered structure consisting of silicon oxide or a double layered structure consisting of a silicon nitride layer and a silicon oxide layer;

wherein the bottom grid is a single layered aluminum structure, a single layered molybdenum structure or a triple layered structure that a layer of aluminum clamped by two layers of molybdenum; thickness of the bottom grid is 1500~2000 A;

wherein the top grid is a single layered aluminum structure, a single layered molybdenum structure or a triple layered structure that a layer of aluminum clamped by two layers of molybdenum; thickness of the top grid is 1500~2000 A.

12. The TFT substrate according to claim 11, wherein size, thickness and material of the top grid and the bottom grid are the same.

* * * * *